(12) United States Patent
Hirano et al.

(10) Patent No.: US 6,521,919 B2
(45) Date of Patent: Feb. 18, 2003

(54) SEMICONDUCTOR DEVICE OF REDUCED THERMAL RESISTANCE AND INCREASED OPERATING AREA

(75) Inventors: Noritoshi Hirano, Amagasaki (JP); Katsumi Satoh, Chiyoda-ku (JP); Yoshihiro Yamaguchi, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,985

(22) Filed: Mar. 22, 2001

(65) Prior Publication Data

US 2002/0033487 A1 Mar. 21, 2002

(30) Foreign Application Priority Data

Sep. 19, 2000 (JP) ........................................ 2000-283492

(51) Int. Cl.$^7$ ........................ H01L 29/74; H01L 31/111
(52) U.S. Cl. ...................... 257/147; 257/139; 257/140; 257/146; 257/132
(58) Field of Search ................................ 257/147, 140, 257/146, 139, 339, 341, 342, 378, 138, 132

(56) References Cited

U.S. PATENT DOCUMENTS 5,289,019 A * 2/1994 Terashima .................. 257/139
5,702,961 A 12/1997 Park

FOREIGN PATENT DOCUMENTS

| JP | 59-51569 | * 3/1984 | ................. 257/138 |
|----|----------|----------|---------------------------|
| JP | 2-309676 | 12/1990 | |
| JP | 9-191110 | 7/1997 | |

* cited by examiner

Primary Examiner—Steven Loke
(74) Attorney, Agent, or Firm—Oblon, Spivak, McClelland, Maier & Neustadt, P.C.

(57) ABSTRACT

A semiconductor device is composed a semiconductor substrate having a first conducting-type first semiconductor layer, a second conducting-type second semiconductor layer, a first conducting-type third semiconductor layer, a second conducting-type fourth semiconductor layer and a first conducting-type fifth semiconductor layer, a first main electrode for short-circuiting the first semiconductor layer and the second semiconductor layer, a second main electrode for short-circuiting the fourth semiconductor layer and the fifth semiconductor layer, and a control electrode provided on the third semiconductor layer. The first semiconductor layer and the second semiconductor layer form a joint. The second semiconductor layer and the third semiconductor layer form a joint. The third semiconductor layer and the fourth semiconductor layer form a joint. The fourth semiconductor layer and the fifth semiconductor layer form a joint.

8 Claims, 6 Drawing Sheets

SEMICONDUCTOR DEVICE OF REDUCED THERMAL RESISTANCE AND INCREASED OPERATING AREA

BACKGROUND OF THE INVENTION

1. Field of the Invention

The present invention relates to a semiconductor device having switching function such as IGBT (Insulated Gate Bipolar Transistor), GCT (Gate Commutated Turn-off Thyristor) or GTO (Gate Turn-off Thyristor).

2. Description of the Background Art

Figure 8:
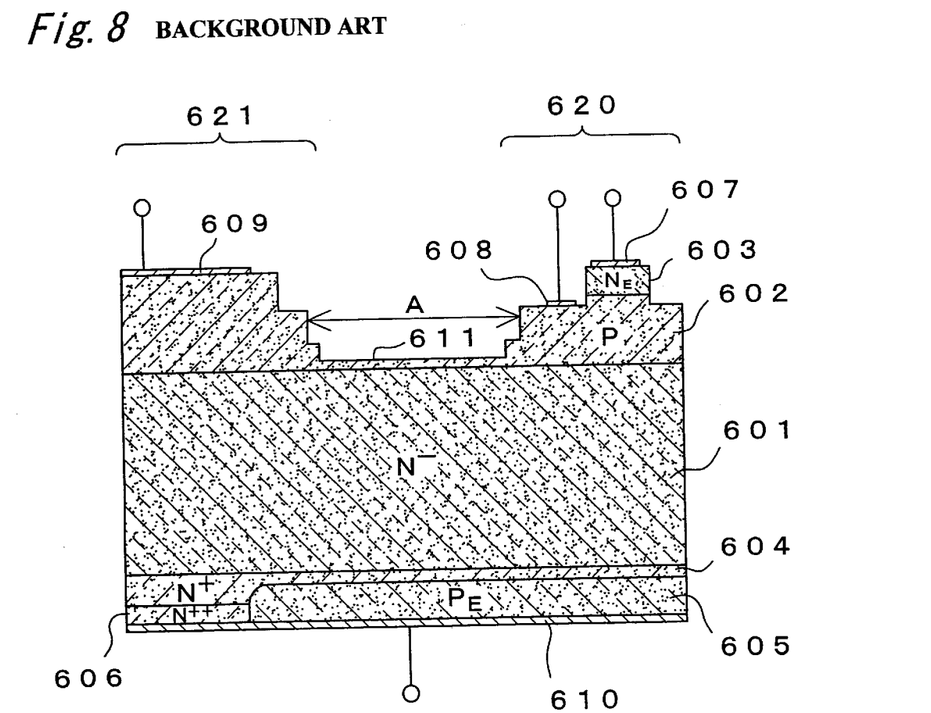
FIG. 8 is a cross section showing a structure of a conventional reverse conducting GTO.

FIG. 8 is a cross section showing a structure of a conventional reverse conducting GTO. Here, there will be explained below GTO as an example of a semiconductor device having a switching function. Normally, the reverse conductive GTO is constituted so that a GTO area is connected to a free wheeling diode area in antiparallel and these areas are integrated in one semiconductor substrate.

In the conventional reverse conducting GTO, a P layer 602, and an $N_E$ layer 603 are diffused on a semiconductor substrate N-layer 601 made of silicon or the like in order from a cathode side in a GTO area 620. Similarly an $N^+$ layer 604 and a $P_E$ layer 605 are diffused in order from an anode side. In a diode area 621, the P layer 602 is diffused on the semiconductor substrate $N^-$ layer 601 made of silicon or the like from the cathode side, and the $N^+$ layer 604 and an $N^{++}$ layer 606 are diffused in order from the anode side.

In addition, this reverse conducting GTO has a cathode electrode 607 and a gate electrode 608 in the GTO area, a cathode electrode 609 in the diode area and an anode electrode 610 in the whole area. In a separating area which separates the GTO area 620 from the diode area 621, an etching section 611 is provided on a portion of the P layer 602 which remains on the $N^-$ layer 601 after a diffusion area of the P layer 602 of about 90 µm is etched down by about 60 µm, and the width A of the etching portion is about 5 mm. Resistance of 300 to 500Ω is provided between the GTO area 620 and the diode area 621 and they are separated by the etching area with the width A of about 5 mm. Paying attention to thermal resistance, thermal resistance is generated on the surface of the GTO area 620 at the time of operating GTO, and on the surface of the diode area 621 at the time of operating diode.

Further, relating techniques are disclosed in Japanese Patent Application Laid-Open Nos. 9-191110 (1997) and 2-309676 (1990). Japanese Patent Application No. 9-191110 (1997) discloses an insulating gate bipolar transistor containing a diode. In this transistor, a cathode electrode and a collector electrode are integrated, and an anode electrode and an emitter electrode are integrated so that a size of the whole transistor is reduced.

Japanese Patent Application Laid-Open No. 2-309676 (1990) discloses a reverse conducting-type insulated gate bipolar transistor. In this transistor, a source of IGBT and an anode of a diode are formed by one electrode, and a collector of IGBT and a cathode of the diode are formed by one electrode.

In the conventional reverse conducting GTO (FIG. 8), since the GTO area 620 and the diode area 621 are separated by high resistance, the separating area is required. Moreover, in this reverse conducting GTO, since thermal resistance is generated on the surface of the GTO area 620 and on the surface of the diode area 621, there arises a problem that the thermal resistance in the reverse conducting GTO is high.

Further, as for both the diodes disclosed in Japanese Patent Application Laid-Open Nos. 9-191110 (1997) and 2-309676 (1990), a switching element and the diode use one electrode so that the whole diode becomes compact. However, a separating area which separates the switching element area from the diode area is required. There arises a problem that an actual operating area is reduced due to this separating area and thus a performance of a semiconductor device is deteriorated.

SUMMARY OF THE INVENTION

The present invention is devised in order to solve the above problems, and it is an object of the present invention to provide a semiconductor device in which a switching ability and a diode ability can be used properly in a regular direction and a reverse direction in one structure, thereby increasing a surface area of a chip and reducing thermal resistance, and a separating area is eliminated, thereby increasing an actual operating area.

In order to achieve the above objects, a first aspect of the invention provides a semiconductor device characterized by including: a semiconductor substrate; wherein the semiconductor includes: a first conducting-type first semiconductor layer; a second conducting-type second semiconductor layer; a first conducting-type third semiconductor layer; a second conducting-type fourth semiconductor layer; and a first conducting-type fifth semiconductor layer; a first main electrode for short-circuiting the first semiconductor layer and the second semiconductor layer; a second main electrode for short-circuit the fourth semiconductor layer and the fifth semiconductor layer; and a control electrode provided on the third semiconductor layer. The semiconductor device is characterized in that the first semiconductor layer and the second semiconductor layer form a joint, the second semiconductor layer and the third semiconductor layer forms a joint, the third semiconductor layer and the fourth semiconductor layer form a joint, and the fourth semiconductor layer and the fifth semiconductor layer form a joint.

In accordance with the semiconductor device of the first aspect of the present invention, the area having the switching ability and the area having the diode ability are provided and they commonly have the PN joint so that the surface area is increased and the thermal resistance can be reduced. Further, since an area which separates the area having the switching ability from the area having the diode ability is not provided, the actual operating area can be increased.

The semiconductor device of the second aspect of the invention, which relates to the semiconductor device of the first aspect, is characterized in that the first semiconductor layer and the third semiconductor layer are separated by the second semiconductor layer, and the third semiconductor layer and the fifth semiconductor layer are separated by the fourth semiconductor layer.

In accordance with the semiconductor device of the second aspect of the present invention, the area having the switching ability and the area having the diode ability are provided and they commonly have the PN joint so that the surface area is increased and the thermal resistance can be reduced. Further, since an area which separates the area having the switching ability from the area having the diode ability is not provided, the actual operating area can be increased.

The semiconductor device of the third aspect of the invention, which relates to the semiconductor device of the first aspect, is characterized in that the first semiconductor layer and the second semiconductor layer are exposed from a first main surface of the semiconductor substrate, and the first semiconductor layer is surrounded by the second semiconductor layer.

In accordance with the semiconductor device of the third aspect of the present invention, the area having the switching ability and the area having the diode ability are provided and they commonly have the PN joint so that the surface area is increased and the thermal resistance can be reduced. Further, since an area which separates the area having the switching ability from the area having the diode ability is not provided, the actual operating area can be increased.

The semiconductor device of the fourth aspect of the invention, which relates to the semiconductor device of the first aspect, is characterized in that the fourth semiconductor layer and the fifth semiconductor layer are exposed from a second main surface of the semiconductor substrate, and the fifth semiconductor layer is surrounded by the fourth semiconductor layer.

In accordance with the semiconductor device of the fourth aspect of the present invention, the area having the switching ability and the area having the diode ability are provided and they commonly have the PN joint so that the surface area is increased and the thermal resistance can be reduced. Further, since an area which separates the area having the switching ability from the area having the diode ability is not provided, the actual operating area can be increased.

The semiconductor device of the fifth aspect of the invention, which relates to the semiconductor device of the first aspect, is characterized in that the first conducting type is p type.

In accordance with the semiconductor device of the fifth aspect of the present invention, the area having the switching ability and the area having the diode ability are provided and they commonly have the PN joint so that the surface area is increased and the thermal resistance can be reduced. Further, since an area which separates the area having the switching ability from the area having the diode ability is not provided, the actual operating area can be increased.

The semiconductor device of the sixth aspect of the invention, which relates to the semiconductor device of the first aspect, is characterized in that the first semiconductor layer is exposed from a first main surface of the semiconductor substrate and a maximum width in a short-length direction of the exposed surface of the first semiconductor layer is not more than 100 $\mu$m.

In accordance with the semiconductor device of the sixth aspect of the present invention, the effect which is similar to that of the semiconductor device of the first aspect of the invention can be obtained. Further, the maximum width in the short-length direction of the exposed surface of the first semiconductor layer is set to not more than 100 $\mu$m so that the semiconductor device can be prevented from being broken due to the spike voltage at the time of the switching operation.

The semiconductor device of the seventh aspect of the invention, which relates to the semiconductor device of the first aspect, is characterized in that the first main electrode is a cathode and the control electrode is provided only on the third semiconductor layer.

In accordance with the semiconductor device of the seventh aspect of the present invention, the effect which is similar to that of the semiconductor device of the first aspect of the present invention can be obtained. Further, the area having the switching ability can be formed as GCT, GTO or the like.

The semiconductor device of the eighth aspect of the invention, which relates to the semiconductor device of the first aspect, characterized in that the first and second main electrodes are pressed by a metal plate.

In accordance with the semiconductor device of the eighth aspect of the present invention, the effect which is similar to that of the semiconductor device of the first aspect of the present invention can be obtained. Further, the structure which can be used more easily can be obtained.

The semiconductor device of the ninth aspect of the invention, which relates to the semiconductor device of the first aspect, is characterized in that a dielectric layer is provided between the control electrode and the third semiconductor layer.

In accordance with the semiconductor device of the ninth aspect of the present invention, the effect which is similar to that of the semiconductor device of the first aspect of the present invention can be obtained. Further, the area having the switching ability can be formed as IGBT or the like.

The semiconductor device of the tenth aspect of the invention, which relates to the semiconductor device of the ninth aspect, is characterized in that a portion of the control electrode is positioned on the second semiconductor layer or on the second semiconductor layer and the first semiconductor layer.

In accordance with the semiconductor device of the tenth aspect of the present invention, the effect which is similar to that of the semiconductor device of the ninth aspect of the present invention can be obtained. Further, the area having the switching ability can be formed as IGBT or the like.

The semiconductor device of the eleventh aspect of the invention, which relates to the semiconductor device of the ninth aspect, is characterized in that the first main electrode is an anode.

In accordance with the semiconductor device of the eleventh aspect of the present invention, the effect which is similar to that of the semiconductor device of the ninth aspect of the present invention can be obtained. Further, the area having the switching ability can be formed as IGBT or the like.

The semiconductor device of the twelfth aspect of the invention, which relates to the semiconductor device of the ninth aspect, is characterized in that in the case where an electric potential of the first main electrode is higher than an electric potential of the second main electrode, an electric potential of the control electrode is controlled to not more than the electric potential of the first main electrode.

In accordance with the semiconductor device of the twelfth aspect of the present invention, the effect which is similar to that of the semiconductor device of the ninth aspect of the present invention can be obtained. Further, the structural breakdown of the PN joint can be prevented in the case where a reverse voltage is applied.

DETAILED DESCRIPTION OF THE PREFERRED EMBODIMENTS

There will be described below embodiments of the present invention with reference to the drawings.

First Embodiment

Figure 1:
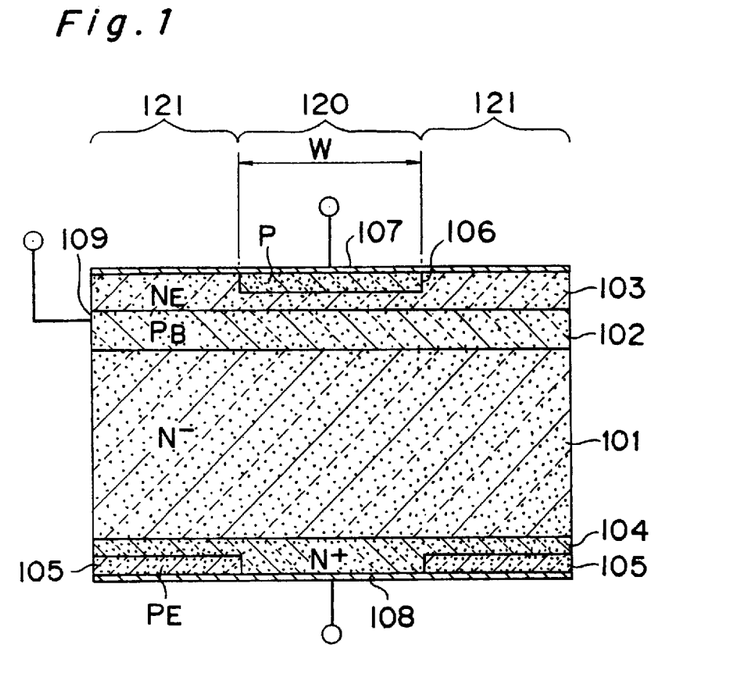
FIG. 1 is a cross section showing a structure of a semiconductor device in a first embodiment.

FIG. 1 is a cross section showing a structure of a semiconductor device in a first embodiment. As shown in FIG. 1, a semiconductor device is composed of a semiconductor substrate having an N⁻ layer 101, a $P_B$ layer 102, an $N_E$ layer 103, an N⁺ layer 104, a $P_E$ layer 105 and a P layer 106, a cathode electrode 107, an anode electrode 108 and a control (gate) electrode 109 in the $P_B$ layer 102. The N⁻ layer 101 and the $P_B$ layer 102 form a PN joint. The $P_B$ layer 102 and the $N_E$ layer 103 form a PN joint. The $N_E$ layer 103 and the P layer 106 form a PN joint. The N⁺ layer 104 and the $P_E$ layer 105 form a PN joint.

In addition, the $N_E$ layer 103 and the P layer 106 are exposed from a surface where the semiconductor substrate contacts with the cathode electrode 107, and the $N_E$ layer 103 surrounds the P layer 106. Here, the cathode electrode 107 short-circuits the $N_E$ layer 103 and the P layer 106. The exposed surface of the P layer 106 is rectangular, oval or the like, and it is preferable its maximum length of a short-length direction is not more than 100 μm. In FIG. 1, the maximum length in the short-length direction of the exposed surface of the P layer 106 corresponds to a width W of the P layer 106 or an interval W of the $P_E$ layer 105. The N⁺ layer 104 and the $P_E$ layer 105 are exposed from a surface where the semiconductor substrate contacts with the anode electrode 108, and the $P_E$ layer 105 surrounds the N⁺ layer 104. The anode electrode 108 short-circuits the N⁺ layer 104 and the $P_E$ layer 105.

In addition, the $P_B$ layer 102 and the P layer 106 are separated by the $N_E$ layer 103. The $P_B$ layer 102 and the $P_E$ layer 105 are separated by the N⁻ layer 101 and the N⁺ layer 104.

With the above structure, this semiconductor device is composed so that the diode area 120 and the GTO area 121 which serves as a switching element are provided in same structure. In the semiconductor device, the diode area 120 and the GTO area 121 are connected in antiparallel so as to compose a circuit. In this structure, an area which separates the diode area 120 from the GTO area 121 is not provided.

Figure 2:
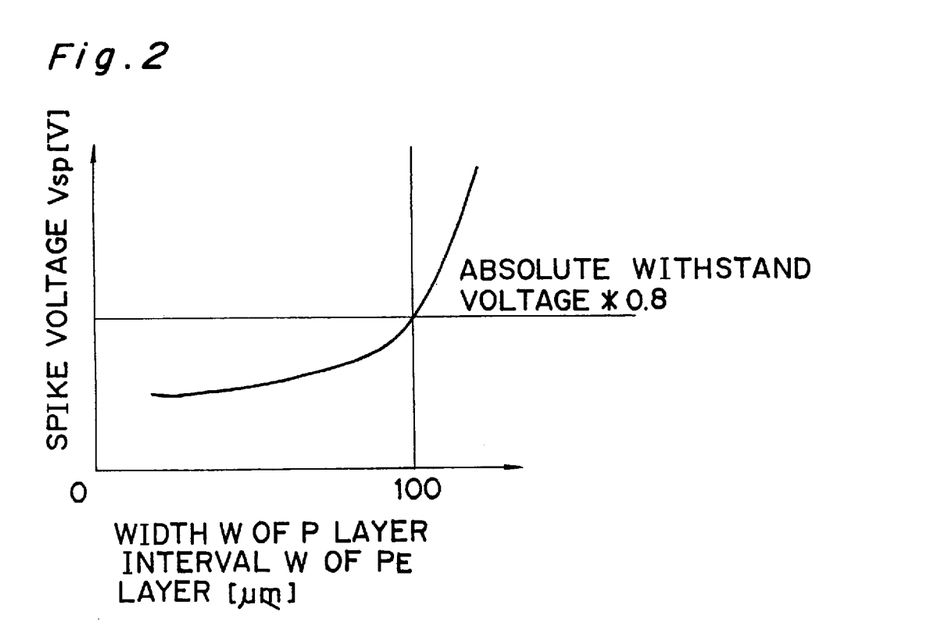
FIG. 2 is a graph showing a relationship between a width W of a P layer 106 or an interval W of a $P_E$ layer 105 and a spike voltage.

Next, there will be explained below as to that the width W of the P layer 106 or the interval W of the $P_E$ layer 105 is preferably not more than 100 μm. FIG. 2 is a graph showing a relationship between the width W of the P layer 106 or the interval W of the $P_E$ layer 105 and a spike voltage. The width W of P layer 106 strongly relates to the interval of the $P_E$ layer 105, and they influence rising or the like at the time of switching operation.

As shown in FIG. 2, as the width W of the P layer 106 or the interval W of the $P_E$ layer 105 becomes wider, a spike voltage $V_{sp}$ becomes larger. When the width W of the P layer 106 or the interval W of the $P_E$ layer 105 exceeds 100 μm, the spike voltage $V_{sp}$ exceeds a value of absolute withstand voltage×0.8. In order to prevent the semiconductor device from being broken due to the spike voltage $V_{sp}$, the width W of the P layer 106 or the interval W of the $P_E$ layer 105 is set to no more than 100 μm. Here, the absolute withstand voltage is a limit value which causes breakdown of the semiconductor device under any conditions.

Next, there will be explained below a semiconductor device manufacturing method with reference to FIGS. 3A through 3C and FIGS. 4A and 4B.

FIGS. 3A through 3C and FIGS. 4A and 4B are cross sections showing the steps of manufacturing the semiconductor device.

Figure 3A:
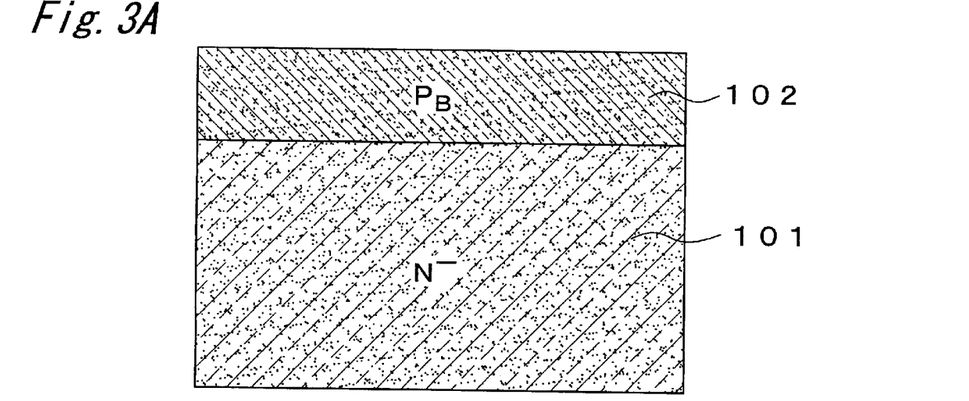
FIGS. 3A through 3C are cross sections showing the steps of manufacturing the semiconductor device in the first embodiment.
Figure 3B:
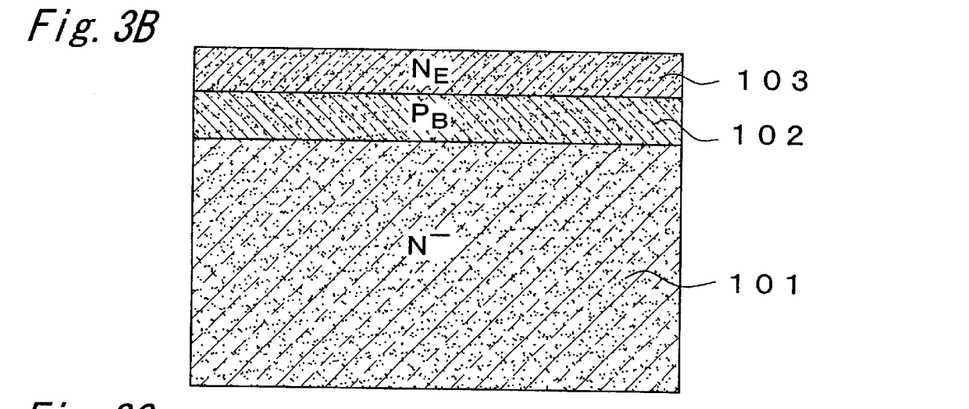
Figure 3C:
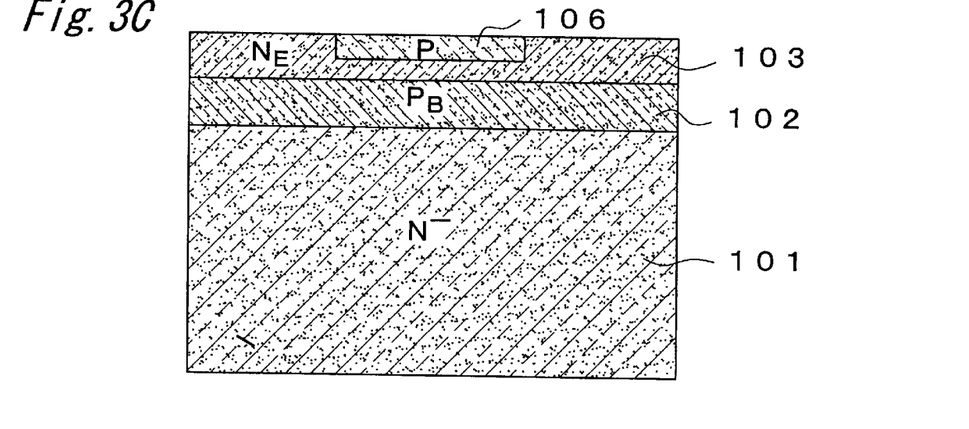

At first, boron which is a dopant as impurity is injected from a cathode side (upper side of the drawing) into the semiconductor substrate N⁻ layer 101 made of silicon or the like by using an ion injecting method so that the dopant is introduced. Thereafter, the substrate is heated for a long time at a temperature of not less than 1200° C. and the impurity is diffused so that the $P_B$ layer 102 is formed (FIG. 3A). Next, phosphorus which is a dopant as impurity is injected from the cathode side by using the ion injecting method and is diffused similarly so that the $N_E$ layer 103 is formed (FIG. 3B). Next, boron with high density is injected from the cathode side and partially diffused so that the P layer 106 with high density is formed (FIG. 3C). At this time, a conventional method of forming a mask and injecting boron into an unnecessary portion is not needed.

Figure 4A:
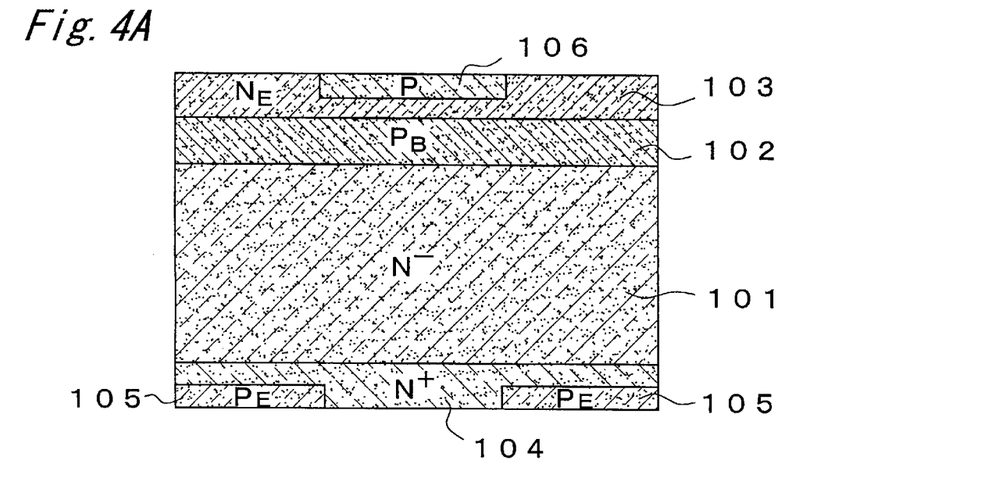
FIGS. 4A and 4B are cross sections showing the steps of manufacturing the semiconductor device in the first embodiment.
Figure 4B:
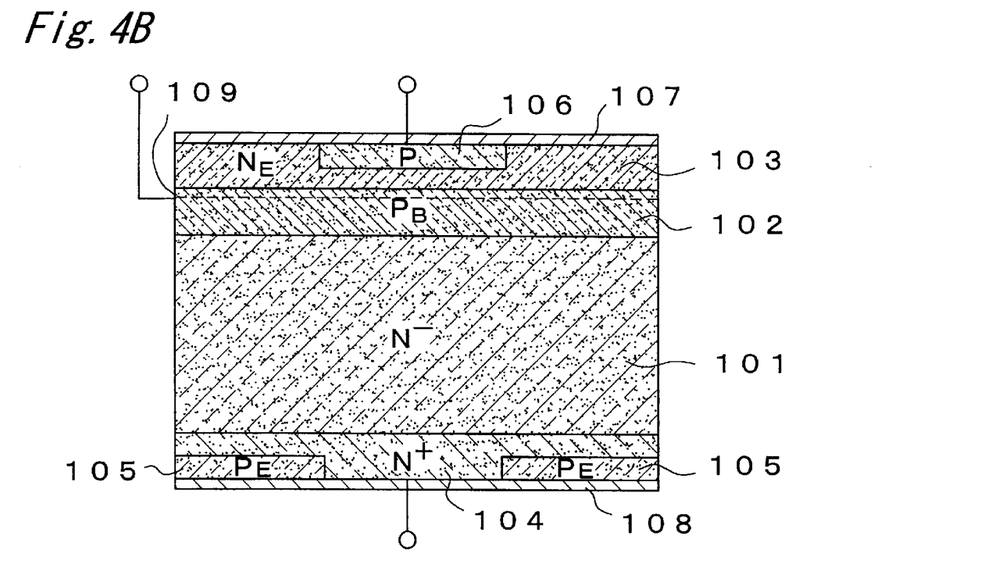

Next, phosphorus with high density is injected from an anode side (lower side of the drawing) and is diffused so that the N⁺ layer 104 is formed. Further, boron is injected from the anode side and is partially diffused so that the $P_E$ layer 105 is formed (FIG. 4A). At this time, a conventional method of forming a mask and injecting boron into an unnecessary portion is not needed. Moreover, the $P_E$ layer 105 which is diffused from the anode side forms an anode short structure partially. Next, the cathode electrode 107 is provided so as to short-circuit the $N_E$ layer 103 and the P layer 106, and the anode electrode 108 is provided so as to short-circuit the N⁺ layer 104 and the $P_E$ layer 105. Further, a control electrode 109 is taken out from the $P_E$ layer 102 (FIG. 4B).

Next, there will be explained below another structure of the semiconductor device.

Figure 5:
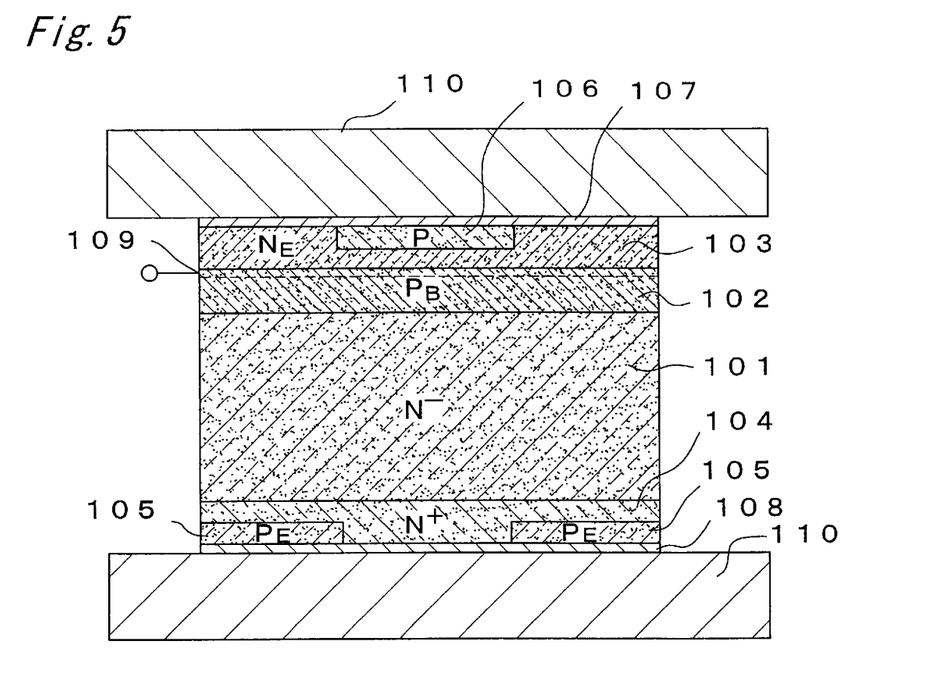
FIG. 5 is a cross section showing a structure of the semiconductor device in the first embodiment.

FIG. 5 is a cross section of the semiconductor device in the first embodiment.

As shown in FIG. 5, the semiconductor device has a cold welding structure in which the cathode electrode 107 and the anode electrode 108 of the semiconductor device shown in FIG. 1 are pressed by a metal plate made of, for example, molybdenum or the like. With this structure, the semiconductor device can be used easily.

In the semiconductor device according to the first embodiment of the present invention, the GTO area 121 having the switching ability and the diode area 120 having the diode ability coexist in the one structure, thereby increasing the area of the chip and reducing the thermal resistance. Further, the semiconductor device in the first embodiment does not require a conventional separating area, and the GTO area 121 and the diode area 120 commonly have the PN joint so that the actual operating area can be enlarged.

Second Embodiment

Figure 6:
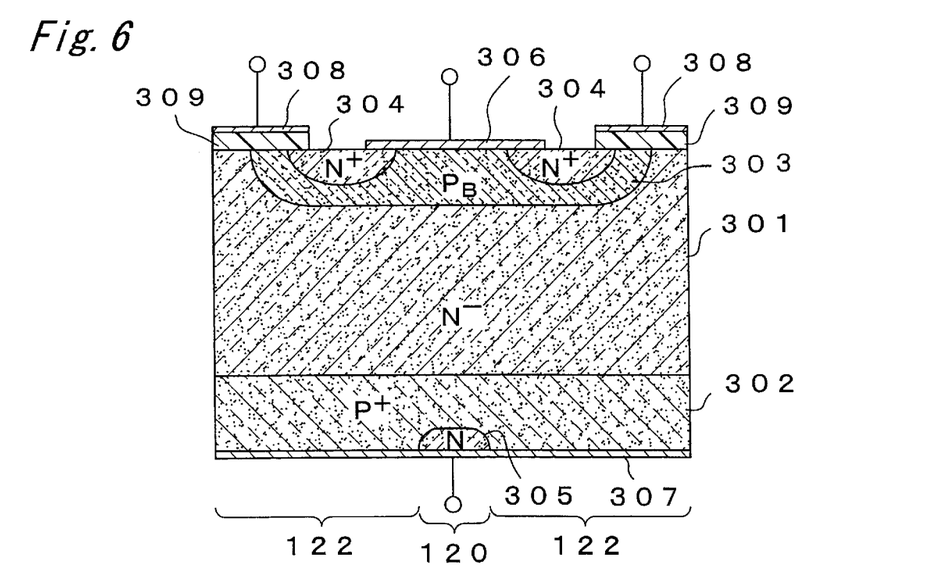
FIG. 6 is a cross section showing a structure of the semiconductor device in a second embodiment.

FIG. 6 is a cross section showing a structure of the semiconductor device in a second embodiment. As shown in FIG. 6, the semiconductor device is composed of a semiconductor substrate having an N⁻ layer 301, a P⁺ layer 302, a $P_B$ layer 303, N⁺ layers 304 and an N layer 305, an emitter electrode 306, a collector electrode 307, control electrodes 308 and oxide films 309 which serves as a dielectric. The N⁻ layer 301 and the P⁺ layer 302 form a PN joint. The P⁺ layer 302 and the N layer 305 form a PN joint. The N⁻ layer 301 and the $P_B$ layer 303 form a PN joint. The $N^+$ layers 304 and the $P_E$ layer 303 form PN joints.

In addition, the $P_B$ layer 303 and the $N^+$ layers 304 are exposed from a surface where the semiconductor substrate contacts with the emitter electrode 306, and the $P_B$ layer 303 surrounds the $N^+$ layers 304. Here, the emitter electrode 306 short-circuits the $N^+$ layers 304 and the $P_B$ layer 303, and serves also as an anode electrode. The N layer 305 and the $P^+$ layer 302 are exposed from a surface where the semiconductor substrate contacts with the collector electrode 307, and the $P^+$ layer 302 surrounds the N layer 305. The collector electrode 307 short-circuits the $P^+$ layer 302 and the N layer 305, and serves also as a cathode electrode.

In addition, the $N^+$ layers 304 and the $N^-$ layer 301 are separated by the $P_B$ layer 303. The N layer 305 and the $N^-$ layer 301 are separated by the $P^+$ layer 302. Further, the oxide films 309 as insulators are provided on the $N^-$ layer 301 and the $P_B$ layer 303 and the $N^+$ layers 304 so as to contact with the $N^-$ layer 301 and the $P_B$ layer 303 and the $N^+$ layers 304. The control electrodes 308 are provided on the oxide films 309.

According to the above structure, in the semiconductor device, the diode area 120 and IGBT area 122 which serves as a switching element are provided in the same structure. In the semiconductor device, the diode area 120 and the IGBT area 122 are connected in antiparallel so as to form a circuit. In this structure, an area which separates the diode area 120 from the IGBT area 122 is not provided.

Next, there will be explained below an off state of the semiconductor device.

Figure 7:
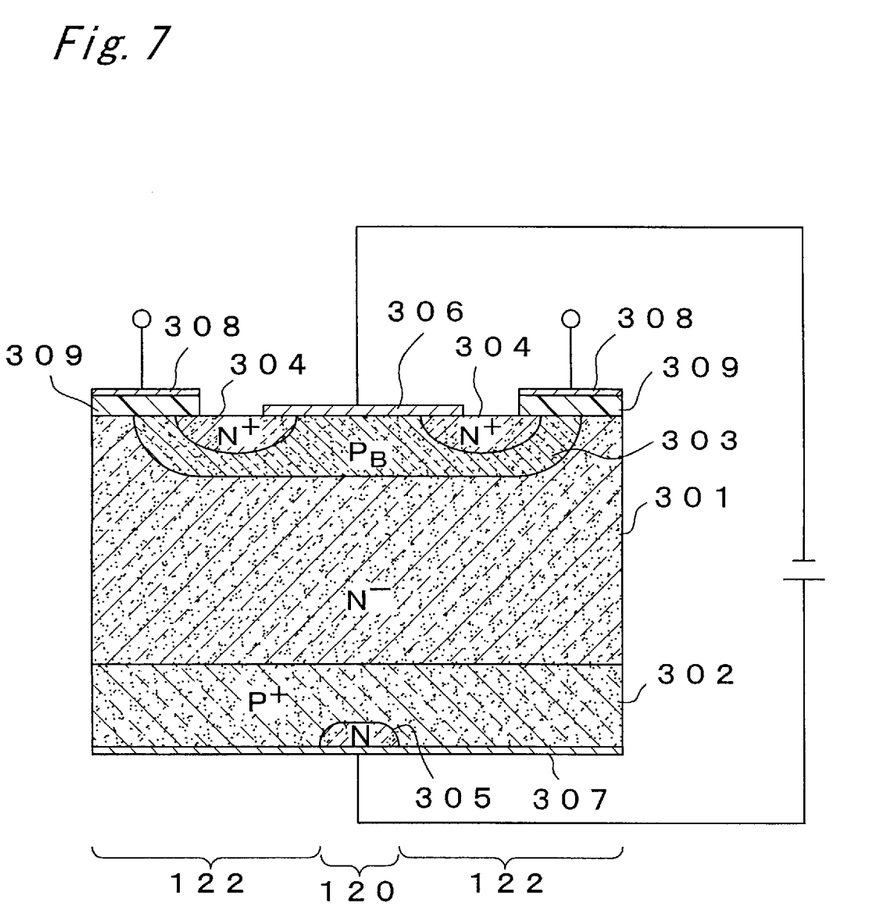
FIG. 7 is an explanatory diagram for explaining an off state of the semiconductor device in the second embodiment.

FIG. 7 is an explanatory diagram for explaining the off state of the semiconductor device in the second embodiment.

As shown in FIG. 7, an electric potential of the collector (cathode) electrode 307 is higher than an electric potential of the emitter (anode) electrode 306. When a difference in the electric potential between the collector electrode 307 and the emitter electrode 306 is small, an electric current does not flow. However, the difference in the electric potential is large, a breakdown phenomenon that an electric current abruptly flows occurs. When the difference in the electric potential becomes larger, there is a possibility that the PN joint is structurally broken. In order to prevent the structural breakdown of the PN joint, an electric potential of the control electrodes 308 is set to be lower than the electric potential of the emitter electrode 306.

This is because when the electric potential of the control electrodes 308 is set to be lower than the electric potential of the emitter electrode 306, surface density of the $N^-$ layer 301 and the $N^+$ layers 304 just below the control electrodes 308 via the oxide films 309 is inverted so that the $P_B$ layer 303 can be thick. When the $P_B$ layer 303 is thick, a flow of the electric current from the $N^-$ layer 301 to the $N^+$ layer 303 can be prevented, and the structural breakdown of the PN joint between the $P_B$ layer 303 and the $N^-$ layer 301 can be prevented. Therefore, in the case where a reverse voltage is applied to the semiconductor device, the electric potential of the control electrodes 308 is controlled so as to be not more than the electric potential of the emitter electrode 306.

Next, there will be explained below the semiconductor device manufacturing method according to the second embodiment. Similarly to the semiconductor device manufacturing method in the first embodiment, a dopant as impurity is injected by the ion injecting method and after the dopant is introduced, the substrate is heated for a long time at a temperature of not less than 1200° C. and impurity is diffused so that the respective semiconductor layers are formed. Needless to say, in order not to inject the dopant into an unnecessary portion, a mask is formed by the conventional method.

At first, boron is injected from a first surface side of the semiconductor substrate into the semiconductor substrate $N^-$ layer 301 made of silicon or the like and is diffused so that the $P_B$ layer 303 is formed. Here, a first surface means upper side of FIG. 7. Next, phosphorus with high density is injected from the first surface side and is diffused similarly so that the $N^+$ layers 304 are formed. At this time, a plurality of the diffused $N^+$ layers 304 is formed partially.

Next, boron with high density is injected from a second surface side and is diffused so that the $P^+$ layer 302 is formed. Here, a second surface means lower side of FIG. 7. Next, phosphorus is injected from the second surface side and is diffused so that the N layer 305 is formed. Next, the oxide films 309 are formed on the $N^-$ layer 301 and the $P_B$ layer 303 and the $N^+$ layers 304 of the first surface. Next, the control electrodes 308 are provided on the oxide films 309, and the emitter electrode 306 is provided so as to short-circuit the $P_B$ layer 303 and the $N^+$ layers 304. The collector electrode 307 is provided so as to short-circuit the $P^+$ layer 302 and the N layer 305.

In the semiconductor device in the second embodiment, the IGBT area 122 having the switching ability and the diode area 120 having the diode ability coexist in the one structure, thereby increasing the area of the chip, and reducing the thermal resistance. Further, the semiconductor device in the second embodiment does not require the conventional separating area, and the IGBT area 122 and the diode area 120 commonly have the PN joint so that the actual operating area can be enlarged.

What is claimed is:

1. A semiconductor device, comprising:
 a semiconductor substrate; wherein the semiconductor substrate includes:
  a first conducting-type first semiconductor layer;
  a second conducting-type second semiconductor layer;
  a first conducting-type third semiconductor layer;
  a second conducting-type fourth semiconductor layer; and
  a first conducting-type fifth semiconductor layer;
 a first main electrode for short-circuiting said first semiconductor layer and said second semiconductor layer;
 a second main electrode for short-circuiting said fourth semiconductor layer and said fifth semiconductor layer; and
 a control electrode connected to said third semiconductor layer,
 wherein said first semiconductor layer and said second semiconductor layer form a joint,
 said second semiconductor layer and said third semiconductor layer form a joint,
 said third semiconductor layer and said fourth semiconductor layer form a joint,
 said fourth semiconductor layer and said fifth semiconductor layer form a joint.

2. The semiconductor device according to claim 1, wherein:
 said first semiconductor layer and said third semiconductor layer are separated by said second semiconductor layer; and
 said third semiconductor layer and said fifth semiconductor layer are separated by said fourth semiconductor layer.

3. The semiconductor device according to claim 1, wherein:

said first semiconductor layer and said second semiconductor layer are exposed from a first main surface of the semiconductor substrate; and said first semiconductor layer is surrounded by said second semiconductor layer.

4. The semiconductor device according to claim 1, wherein:

said fourth semiconductor layer and said fifth semiconductor layer are exposed from a second main surface of the semiconductor substrate; and said fifth semiconductor layer is surrounded by said fourth semiconductor layer.

5. The semiconductor device according to claim 1, wherein said first conducting type is p type.

6. The semiconductor device according to claim 1, wherein said first semiconductor layer is exposed from a first main surface of the semiconductor substrate and a maximum width in a short-length direction of the exposed surface of said first semiconductor layer is not more than 100 µm.

7. The semiconductor device according to claim 1, wherein said first main electrode is a cathode and said control electrode is provided only on said third semiconductor layer.

8. The semiconductor device according to claim 1, wherein said first and second main electrodes are pressed by a metal plate.

* * * * *